United States Patent
Lim

(10) Patent No.: US 10,678,473 B2
(45) Date of Patent: Jun. 9, 2020

(54) STORAGE DEVICE AND SERVER DEVICE

(71) Applicant: Samsung Electronics Co., Ltd., Suwon-si, Gyeonggi-do (KR)

(72) Inventor: Gwang Man Lim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/390,424

(22) Filed: Apr. 22, 2019

(65) Prior Publication Data

US 2020/0125288 A1    Apr. 23, 2020

(30) Foreign Application Priority Data

Oct. 19, 2018 (KR) .................. 10-2018-0124874

(51) Int. Cl.
| | | |
|---|---|---|
| *G06F 13/00* | (2006.01) | |
| *G06F 3/00* | (2006.01) | |
| *G06F 3/06* | (2006.01) | |
| *G08B 5/36* | (2006.01) | |
| *G06F 13/42* | (2006.01) | |
| *H05K 7/14* | (2006.01) | |

(52) U.S. Cl.
CPC .......... *G06F 3/0653* (2013.01); *G06F 3/0626* (2013.01); *G06F 3/0688* (2013.01); *G06F 13/4221* (2013.01); *G08B 5/36* (2013.01); *H05K 7/1402* (2013.01); *G06F 2213/0026* (2013.01)

(58) Field of Classification Search
None
See application file for complete search history.

(56) References Cited

U.S. PATENT DOCUMENTS

| | | | |
|---|---|---|---|
| 6,907,500 B2 * | 6/2005 | Suzuki | G06F 11/006 711/114 |
| 7,209,981 B1 * | 4/2007 | Wade | G06F 3/0626 710/300 |
| 8,069,278 B2 | 11/2011 | Itoh | |
| 9,348,699 B2 | 5/2016 | Okamoto | |

(Continued)

FOREIGN PATENT DOCUMENTS

| | | |
|---|---|---|
| JP | 6-290003 | 10/1994 |
| KR | 1020090097050 | 9/2009 |

(Continued)

OTHER PUBLICATIONS

'Arduino if Statement Code Examples' by Lewis Loflin, archived on Feb. 13, 2018. (Year: 2018).*

(Continued)

*Primary Examiner* — Steven G Snyder
(74) *Attorney, Agent, or Firm* — Myers Bigel, P.A.

(57) ABSTRACT

Provided are a storage device and a server device including the same. The storage device includes a non-volatile memory unit, a connector including a plurality of pins connected to an external host device, a display unit including at least one light-emitting device, and a controller configured to communicate with the host device through the connector and control the non-volatile memory unit. The display unit is separately connected to an interface of the controller that is separate from the connector that connects the storage device to the host device and may display first status information according to control of the controller and/or display second status information according to control of the host device.

20 Claims, 11 Drawing Sheets

(56) References Cited

U.S. PATENT DOCUMENTS

| | | | |
|---|---|---|---|
| 9,460,042 B2 * | 10/2016 | Iskandar | G06F 13/4031 |
| 9,720,616 B2 * | 8/2017 | Yu | G06F 3/0608 |
| 9,904,336 B1 * | 2/2018 | Khan | G06F 1/206 |
| 10,223,316 B2 * | 3/2019 | Mataya | G06F 13/4068 |
| 10,255,215 B2 * | 4/2019 | Breakstone | G06F 13/4022 |
| 10,338,634 B2 * | 7/2019 | Kumagai | |
| 10,402,359 B2 * | 9/2019 | Mataya | |
| 10,452,576 B2 * | 10/2019 | Stuhlsatz | G06F 13/4081 |
| 2004/0049633 A1 * | 3/2004 | Suzuki | G06F 11/006 711/114 |
| 2010/0088432 A1 | 4/2010 | Itoh | |
| 2011/0238900 A1 | 9/2011 | Heo et al. | |
| 2013/0070415 A1 * | 3/2013 | Terry | G06F 1/187 361/679.38 |
| 2013/0229120 A1 * | 9/2013 | Choutov | H05B 33/0815 315/186 |
| 2015/0067226 A1 * | 3/2015 | Iskandar | G06F 13/4031 710/309 |
| 2015/0212888 A1 | 7/2015 | Okamoto | |
| 2016/0070474 A1 * | 3/2016 | Yu | G06F 3/0608 711/103 |
| 2016/0306768 A1 * | 10/2016 | Mataya | G06F 13/4068 |
| 2016/0335220 A1 * | 11/2016 | Breakstone | G06F 13/4068 |
| 2017/0017600 A1 * | 1/2017 | Breakstone | G06F 13/4022 |
| 2017/0220063 A1 * | 8/2017 | Kumagai | G06F 1/16 |
| 2017/0220505 A1 * | 8/2017 | Breakstone | G06F 13/4022 |
| 2017/0220506 A1 * | 8/2017 | Brown | G06F 13/4068 |
| 2017/0228328 A1 | 8/2017 | Armstrong et al. | |
| 2017/0371814 A1 * | 12/2017 | Stuhlsatz | G06F 13/1689 |
| 2018/0101500 A1 * | 4/2018 | Heyd | G06F 13/4022 |
| 2019/0079891 A1 * | 3/2019 | Mataya | G06F 13/4068 |

FOREIGN PATENT DOCUMENTS

| | | |
|---|---|---|
| KR | 1020170040897 | 4/2017 |
| KR | 102017013330 | 12/2017 |

OTHER PUBLICATIONS

'NVM Express Management Interface' Revision 1.0, by NVM Express, Inc., Nov. 17, 2015. (Year: 2015).*

'M.2 XPANDER-AERO' copyright 2019, Micro-Star Int'l Co. Ltd. (Year: 2019).*

'm.2 SSD Activity Light' from UDOO Forum, Apr. 29, 2017. (Year: 2017).*

'PCIe M.2 2280 Specification (HIX Series, 3D TLC), Version 1.1' by Flexxon, Mar. 2018. (Year: 2018).*

'What Is the M.2 Expansion Slot, and How Can I Use It?' by Michael Crider, Aug. 7, 2017. (Year: 2017).*

'Recommended paths for identifying and activating drive LEDs on HPE server platforms' from vmware, last updated Jul. 24, 2018. Year: 2018).*

'Structured Computer Organization—Second Edition' by Andrew S. Tanenbaum, pp. 10-11, copyright 1984. (Year: 1984).*

* cited by examiner

FIG. 3

| | | | |
|---|---|---|---|
| | | Pin75 | GND |
| Pin74 | N/C (or 3.3V) | Pin73 | GND |
| Pin72 | N/C (or 3.3V) | Pin71 | GND |
| Pin70 | N/C (or 3.3V) | Pin69 | |
| Pin68 | SUSCLK(32kHz) | Pin67 | |
| Pin66 | | Pin65 | |
| Pin64 | | Pin63 | |
| Pin62 | | Pin61 | |
| Pin60 | | Pin59 | |
| Pin58 | Reserved MFG_CLOCK | Pin57 | GND |
| Pin56 | Reserved MFG_DATA | Pin55 | REFCLKp |
| Pin54 | PEWAKE# | Pin53 | REFCLKn |
| Pin52 | CLKREQ# | Pin51 | GND |
| Pin50 | PERST#0 | Pin49 | PERp0 |
| Pin48 | | Pin47 | PERn0 |
| Pin46 | | Pin45 | GND |
| Pin44 | ALERT#(0) | Pin43 | PETp0 |
| Pin42 | SMB_DATA(I/O)(0/1.8V) | Pin41 | PETn0 |
| Pin40 | SMB_CLK(I/O)(0/1.8V) | Pin39 | GND |
| Pin38 | | Pin37 | PERp1 |
| Pin36 | | Pin35 | PERn1 |
| Pin34 | | Pin33 | GND |
| Pin32 | | Pin31 | PETp1 |
| Pin30 | | Pin29 | PETn1 |
| Pin28 | | Pin27 | GND |
| Pin26 | | Pin25 | PERp2 |
| Pin24 | | Pin23 | PERn2 |
| Pin22 | | Pin21 | GND |
| Pin20 | | Pin19 | PETp2 |
| Pin18 | N/C (or 3.3V) | Pin17 | PETn2 |
| Pin16 | N/C (or 3.3V) | Pin15 | GND |
| Pin14 | N/C (or 3.3V) | Pin13 | PERp3 |
| Pin12 | 3.3V | Pin11 | PERn3 |
| Pin10 | LED1# | Pin9 | GND |
| Pin8 | | Pin7 | PETp3 |
| Pin6 | | Pin5 | PETn3 |
| Pin4 | N/C | Pin3 | GND |
| Pin2 | N/C | Pin1 | GND |

FIG. 8

| | | | |
|---|---|---|---|
| | | Pin75 | GND |
| Pin74 | N/C (or 3.3V) | Pin73 | GND |
| Pin72 | N/C (or 3.3V) | Pin71 | GND |
| Pin70 | N/C (or 3.3V) | Pin69 | N/C |
| Pin68 | SUSCLK(32kHz) | Pin67 | N/C |
| Pin66 | | Pin65 | |
| Pin64 | | Pin63 | |
| Pin62 | | Pin61 | |
| Pin60 | | Pin59 | |
| Pin58 | Reserved MFG_CLOCK | Pin57 | GND |
| Pin56 | Reserved MFG_DATA | Pin55 | REFCLKp |
| Pin54 | PEWAKE# | Pin53 | REFCLKn |
| Pin52 | CLKREQ# | Pin51 | GND |
| Pin50 | PERST#0 | Pin49 | PERp0 |
| Pin48 | N/C | Pin47 | PERn0 |
| Pin46 | N/C | Pin45 | GND |
| Pin44 | ALERT#(0) | Pin43 | PETp0 |
| Pin42 | SMB_DATA(I/O)(0/1.8V) | Pin41 | PETn0 |
| Pin40 | SMB_CLK(I/O)(0/1.8V) | Pin39 | GND |
| Pin38 | N/C | Pin37 | PERp1 |
| Pin36 | N/C | Pin35 | PERn1 |
| Pin34 | N/C | Pin33 | GND |
| Pin32 | N/C | Pin31 | PETp1 |
| Pin30 | N/C | Pin29 | PETn1 |
| Pin28 | N/C | Pin27 | GND |
| Pin26 | N/C | Pin25 | PERp2 |
| Pin24 | N/C | Pin23 | PERn2 |
| Pin22 | N/C | Pin21 | GND |
| Pin20 | N/C | Pin19 | PETp2 |
| Pin18 | N/C (or 3.3V) | Pin17 | PETn2 |
| Pin16 | N/C (or 3.3V) | Pin15 | GND |
| Pin14 | N/C (or 3.3V) | Pin13 | PERp3 |
| Pin12 | 3.3V | Pin11 | PERn3 |
| Pin10 | LED1# | Pin9 | GND |
| Pin8 | N/C | Pin7 | PETp3 |
| Pin6 | N/C | Pin5 | PETn3 |
| Pin4 | N/C | Pin3 | GND |
| Pin2 | N/C | Pin1 | GND |

KEY: Pin60–Pin66, Pin59–Pin65

CT_2: Pin40, Pin42

FIG. 9

| | | | |
|---|---|---|---|
| | | Pin75 | GND |
| Pin74 | N/C (or 3.3V) | Pin73 | GND |
| Pin72 | N/C (or 3.3V) | Pin71 | GND |
| Pin70 | N/C (or 3.3V) | Pin69 | N/C |
| Pin68 | SUSCLK(32kHz) | Pin67 | N/C |
| Pin66 | KEY | Pin65 | KEY |
| Pin64 | KEY | Pin63 | KEY |
| Pin62 | KEY | Pin61 | KEY |
| Pin60 | KEY | Pin59 | KEY |
| Pin58 | Reserved MFG_CLOCK | Pin57 | GND |
| Pin56 | Reserved MFG_DATA | Pin55 | REFCLKp |
| Pin54 | PEWAKE# | Pin53 | REFCLKn |
| Pin52 | CLKREQ# | Pin51 | GND |
| Pin50 | PERST#0 | Pin49 | PERp0 |
| Pin48 | N/C | Pin47 | PERn0 |
| Pin46 | N/C | Pin45 | GND |
| Pin44 | ALERT#(0) | Pin43 | PETp0 |
| Pin42 | SMB_DATA(I/O)(0/1.8V) | Pin41 | PETn0 |
| Pin40 | SMB_CLK(I/O)(0/1.8V) | Pin39 | GND |
| Pin38 | N/C | Pin37 | PERp1 |
| Pin36 | N/C | Pin35 | PERn1 |
| Pin34 | N/C | Pin33 | GND |
| Pin32 | N/C | Pin31 | PETp1 |
| Pin30 | N/C | Pin29 | PETn1 |
| Pin28 | N/C | Pin27 | GND |
| Pin26 | N/C | Pin25 | PERp2 |
| Pin24 | N/C | Pin23 | PERn2 |
| Pin22 | N/C | Pin21 | GND |
| Pin20 | N/C | Pin19 | PETp2 |
| Pin18 | N/C (or 3.3V) | Pin17 | PETn2 |
| Pin16 | N/C (or 3.3V) | Pin15 | GND |
| Pin14 | N/C (or 3.3V) | Pin13 | PERp3 |
| Pin12 | 3.3V | Pin11 | PERn3 |
| Pin10 | LED1# | Pin9 | GND |
| Pin8 | N/C | Pin7 | PETp3 |
| Pin6 | N/C | Pin5 | PETn3 |
| Pin4 | N/C | Pin3 | GND |
| Pin2 | N/C | Pin1 | GND |

CT_2

FIG. 11
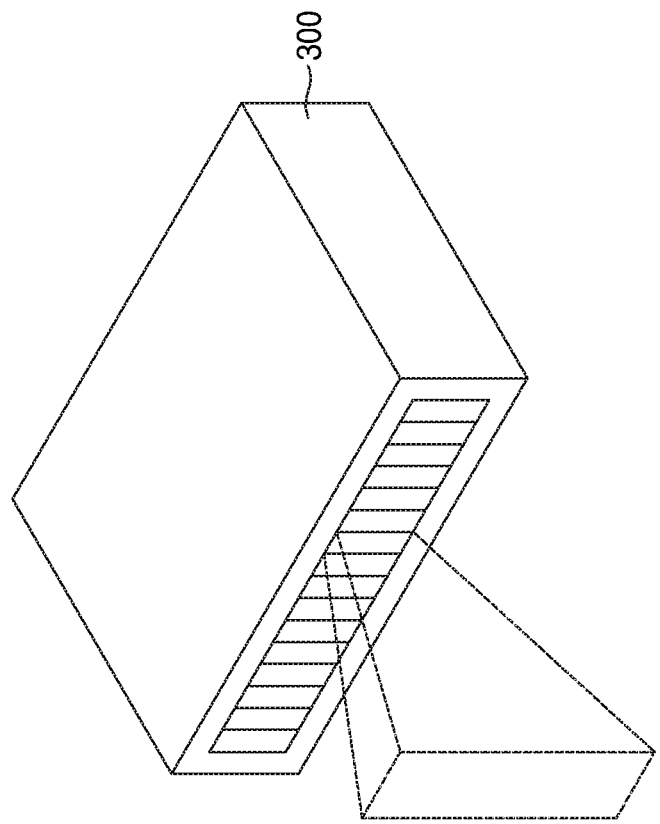
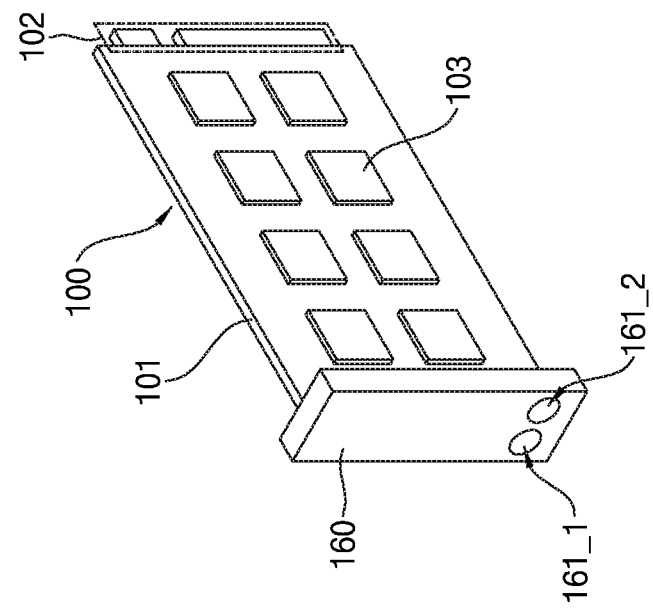

STORAGE DEVICE AND SERVER DEVICE

CROSS-REFERENCE TO RELATED APPLICATION

This application claims from Korean Patent Application No. 10-2018-0124874, filed on Oct. 19, 2018, the disclosure of which is incorporated herein by reference in its entirety.

BACKGROUND

The present disclosure relates to apparatuses and methods related to a storage device and a server device.

Storage devices are devices for storing data according to control of host devices such as a computer, a smart phone, and/or a smart pad. The storage devices include a device for storing data on a magnetic disk, such as a hard disk drive (HDD), and a device for storing data on a semiconductor memory, such as a solid state drive (SSD) and a memory card, that is, a non-volatile memory.

Use of a storage device including a non-volatile memory is expanding from personal computers to business computers such as a data server. With the expansion of use of a storage device, various functions and form factors of storage devices are required in individual fields.

SUMMARY

The example embodiments of the inventive concept are directed to providing an integrated storage device whose display unit operates according to control of a host device and a server device including the integrated storage device. Objects of example embodiments of the inventive concept are not limited to that mentioned above, and other objects not mentioned will be clearly understood by those of ordinary skill in the art from the following description.

According to example embodiments, there is provided a storage device including a non-volatile memory unit, a connector including a plurality of pins connected to a host device that is external to the storage device, a display unit including at least one light-emitting device, and a controller configured to communicate with the host device through the connector and configured to control the non-volatile memory unit. The display unit is connected to an interface of the controller that is separate from the connector that connects the storage device to the host device and may display first status information according to control of the controller and/or display second status information according to control of the host device.

According to example embodiments, there is provided a storage device including a non-volatile memory unit, a connector including a plurality of pins connected to a host device that is external to the storage device, a display unit including at least one light-emitting device, and a controller configured to be connected to the host device through the connector and configured to control the non-volatile memory unit. The display unit is connected to an interface of the controller and may display first status information according to control of the controller and/or display second status information according to control of the host device through the controller.

According to example embodiments, there is provided a server device including a host device and a plurality of storage devices that belong to ones of a plurality of storage groups connected in parallel to the host device. Ones of the plurality of storage devices includes a non-volatile memory unit, a connector including a plurality of pins connected to the host device, a controller configured to communicate with the host device through the connector and configured to control the non-volatile memory unit, and a display unit including a light-emitting device which is configured to display first status information or second status information according to control of the controller or the host device.

BRIEF DESCRIPTION OF THE DRAWINGS

FIG. 3 illustrates first connection terminals according to example embodiments of the inventive concept.

FIGS. 8 and 9 illustrate second connection terminals according to example embodiments of the inventive concept.

FIG. 11 shows a tray and a storage device according to example embodiments of the inventive concept.

DETAILED DESCRIPTION

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below. As used herein, the term "and/or" includes any and all combinations of one or more of the associated listed items. Expressions such as "at least one of," when preceding a list of elements, modify the entire list of elements and do not modify the individual elements of the list. Hereinafter, a storage device and/or a server device according to example embodiments of the inventive concept will be described with reference to the accompanying drawings.

Figure 1A:
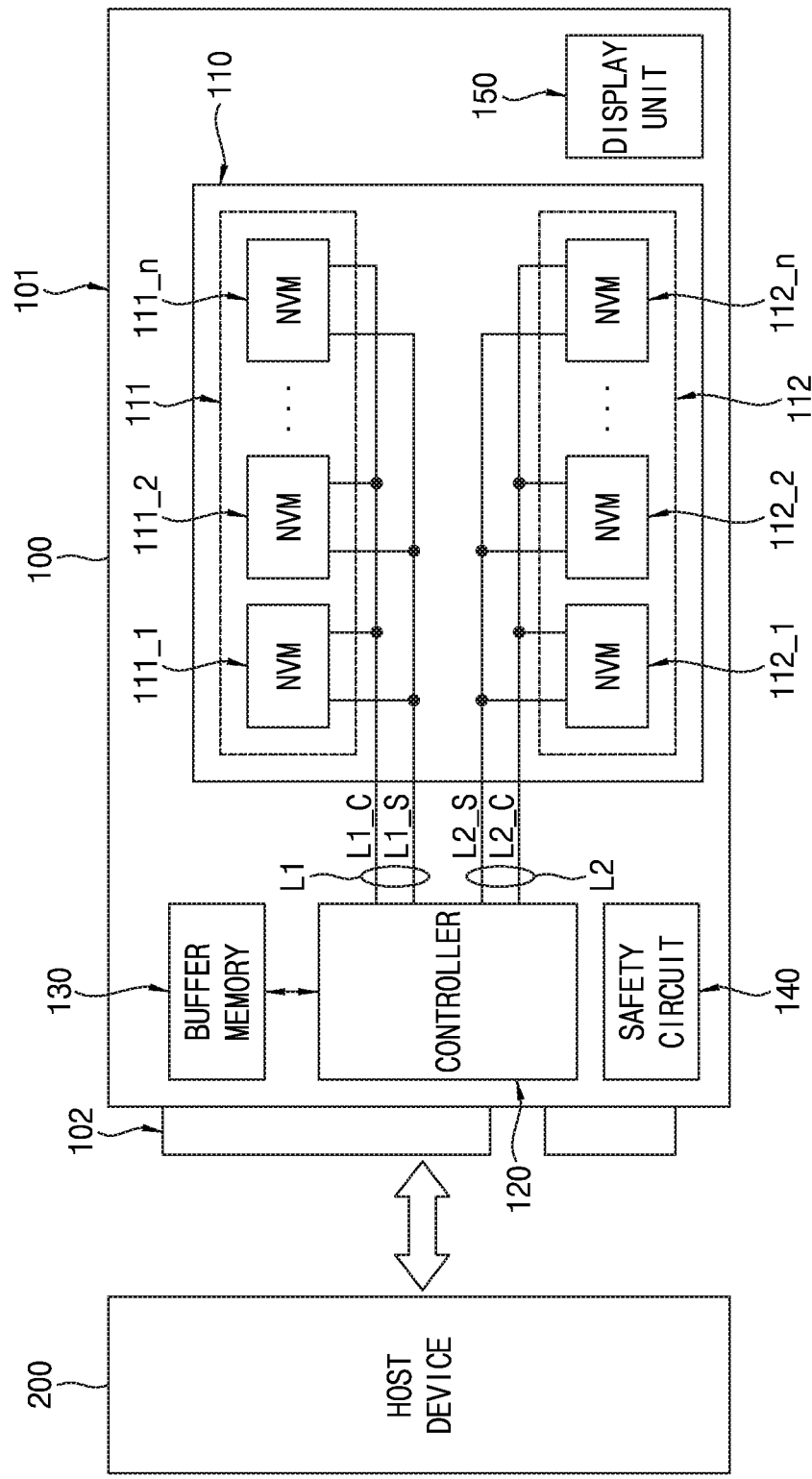
FIGS. 1A and 1B are block diagrams of a storage device and a controller according to example embodiments of the inventive concept, respectively.

FIG. 1A is a block diagram of a storage device 100 according to example embodiments of the inventive concept.

Referring to FIG. 1A, the storage device 100 according to example embodiments of the inventive concept may include a substrate 101, a connector 102, a non-volatile memory unit 110, a controller 120, a buffer memory 130, a safety circuit 140, and a display unit 150. For example, the storage device 100 may be a solid state drive (SSD).

The substrate 101 may be formed of an insulating material such as plastic and may be, for example, a printed circuit board (PCB). The substrate 101 may provide a space in which electronic parts are mounted. For example, the connector 102, the non-volatile memory unit 110, the controller 120, the buffer memory 130, the safety circuit 140, and the display unit 150 may be disposed on at least one of an upper surface and a lower surface of the substrate 101. Wiring on the substrate 101 may electrically connect the connector 102, the non-volatile memory unit 110, the controller 120, the buffer memory 130, the safety circuit 140, and the display unit 150. FIG. 1 does not show detailed wiring to avoid unnecessary complication and conceptually shows wiring among the controller 120, the buffer memory 130, and the non-volatile memory unit 110.

The connector 102 may connect the storage device 100 and an external host device 200. The connector 102 may be a part of the substrate 101 and may be formed of the same material as that of the substrate 101. The connector 102 may be protruding in one direction from one side of the substrate 101. A plurality of pins may be disposed on at least one of an upper surface and a lower surface of the connector 102. The pins may be formed of a conductive material and may provide an electrical connection with the host device 200.

For example, shapes and form factors of the substrate 101 and the connector 102 may conform to the peripheral component interconnect express (PCIe) M.2 standard.

The non-volatile memory unit 110 may include a first non-volatile memory unit 111 and a second non-volatile memory unit 112. It will be understood that, although the terms first, second, third, etc. may be used herein to describe various elements, and elements should not be limited by these terms; rather, these terms are only used to distinguish one element from another element. Thus, a first element discussed could be termed a second element without departing from the scope of the present inventive concepts.

The first non-volatile memory unit 111 may be connected to the controller 120 through first lines L1. The first lines L1 may include first common lines L1_C and first separate lines L1_S. The first non-volatile memory unit 111 may be connected in common to the controller 120 through the first common lines L1_C. For example, the first common lines L1_C may include input and output lines DQ through which data, commands, and addresses are transferred, a write enable signal /WE, a read enable signal /RE, a data strobe signal DQS, a command latch enable signal CLE, an address latch enable signal ALE, and the like. The first non-volatile memory unit 111 may include first non-volatile memories 111_1 to 111_n which may be connected to the controller 120 through the respective dedicated first separate lines L1_S thereof. The first separate lines L1_S may include a chip enable signal /CE, a ready and busy signal RnB, and the like. The second non-volatile memory unit 112 may include second non-volatile memories 112_1 to 112_n which may be connected to the controller 120 through the respective dedicated second separate lines L2_S thereof.

As used herein a "way" denotes an independent non-volatile memory which may be connected to one channel, and "N-ways" denote that N non-volatile memories are connected to one channel. The first non-volatile memory unit 111 may constitute a first channel. The first channel may communicate with the controller 120 through the first lines L1. One non-volatile memory may be selected from the first non-volatile memory unit 111, and the selected non-volatile memory may communicate with the controller 120. While the selected first non-volatile memory communicates with the controller 120, other non-volatile memories that were not selected may be in a standby state.

The second non-volatile memory unit 112 may be connected to the controller 120 through second lines L2. The second lines L2 may include second common lines L2_C and second separate lines L2_S. The second common lines L2_C and the second separate lines L2_S may have similar functions and structures as those of the first common lines L1_C and the first separate lines L1_S, respectively. Descriptions of the second lines L2 which are similar to those of the first lines L1 are not reiterated in the interest of brevity.

The second non-volatile memory unit 112 may communicate with the controller 120 through the second lines L2. A second channel may be constituted in a similar manner as the first channel. The second channel may be controlled by the controller 120 independently from the first channel. Descriptions of the second channel which are similar to those of the first channel are not reiterated in the interest of brevity.

The controller 120 may communicate with the external host device 200 through the connector 102 and receive a command. The command may include a write request, a read request, or a delete request. The controller 120 may control the non-volatile memory unit 110 and the buffer memory 130 according to the command or a schedule established by an internal background operation. The controller 120 may store write data transferred from the host device 200 in the buffer memory 130. The controller 120 may record the write data stored in the buffer memory 130 to the non-volatile memory unit 110. The controller 120 may read data from the non-volatile memory unit 110 and store the read data in the buffer memory 130. The controller 120 may store the data stored in the buffer memory 130 to another position of the non-volatile memory unit 110. For example, the controller 120 may rerecord the data in a storage space of another address. The controller 120 may output data stored in the buffer memory 130 to the host device 200. The controller 120 may select a storage space in the non-volatile memory unit 110 and delete data in the selected storage space.

The controller 120 may store various kinds of metadata required for managing the storage device 100 in the buffer memory 130 or an internal memory (not shown) of the controller 120 and may load the metadata to operate the storage device 100. The controller 120 may store mapping information between logic addresses of the host device 200 and physical addresses of the non-volatile memory unit 110 in the buffer memory 130 or the internal memory (not shown) of the controller 120 and may load metadata to operate the storage device 100.

The buffer memory 130 may be used as an operation memory of the controller 120. For example, the buffer memory 130 may include a dynamic random access memory (DRAM), a static random access memory (SRAM), a phase-change random access memory (PRAM), a ferroelectric random access memory (FRAM), a magnetic random access memory (MRAM), a resistive random access memory (RRAM), and/or the like. The buffer memory 130 may be omitted from the storage device 100 by way of example. When the buffer memory 130 is omitted, various functions which have been described with reference to the buffer memory 130 may be performed by another memory, such as the internal memory (not shown) of the controller 120.

The safety circuit 140 may include a capacitor (not shown). The capacitor may store a large amount of electric charge and is used to accessorily provide power to the storage device 100. For example, when a main power is interrupted, the capacitor may accessorily provide power to the storage device 100 for a certain time period using the stored charge. In other words, the capacitor may function as a backup power source to the main power for operating storage device 100.

The display unit 150 is separately connected to the controller 120 and the host device 200 and may receive a first display signal DS_1 of the controller 120 and a second display signal DS_2 of the host device 200. DS_1 and DS_2 are not shown in FIG. 1A, but are shown in FIGS. 4 to 7. Whether the display unit 150 operates may be determined according to the first display signal DS_1 and/or the second display signal DS_2. The display unit 150 may externally display storage status or status of the host device 200 to a user. The display unit 150 may externally display first status information or second status information according to control of the controller 120 or the host device 200.

The controller 120 may observe status of the storage device 100 and output the first status information indicating the observed status of the storage device 100 as the first display signal DS_1. For example, the first status information of the storage device 100 indicated by the first display signal DS_1 may include memory replacement time information which indicates a replacement time for the non-volatile memory unit 110 corresponding to a critical wear-level, error occurrence information which indicates that an unidentified error has occurred in the storage device 100, temperature status information which indicates whether an internal temperature of the storage device 100 is a certain temperature or higher (i.e. above a threshold), storage capacity information which indicates whether a storage capacity of the non-volatile memory unit 110 is a certain capacity or higher, and/or capacitor replacement time information which indicates a replacement time for the capacitor of the safety circuit 140.

Additionally, the first status information indicated by the first display signal DS_1 may include standby status information which indicates that the storage device 100 is operating normally and any access thereto is not being performed, access status information which indicates that the storage device 100 is operating normally and access thereto is being performed according to a command of the external host device 200 or based on a schedule of the background operation, and/or coupling status information which indicates whether the storage device 100 has been coupled to the host device 200. The status information may provide respective usage information of non-volatile memory units related to ones of the storage devices.

The host device 200 may output the second status information indicating status and the like of the host device 200 as the second display signal DS_2. The second status information which may be indicated by the second display signal DS_2 may include communication interface information between the storage device 100 and the host device 200, temperature status information which indicates whether an internal temperature of the host device 200 is a certain temperature or higher (i.e. greater than a threshold temperature), error occurrence information which indicates that an unidentified error has occurred in the host device 200, and/or fail status information which indicates that a device connected to the host device 200 does not operate normally due to a device failure or device hang. Additionally, the host device 200 may output the second display signal DS_2 to the display unit 150 on a request of a user or under certain conditions.

The first non-volatile memory unit 111, the second non-volatile memory unit 112, the controller 120, the buffer memory 130, and the display unit 150 may be embodied into one or more packages and disposed on the upper or lower surface of the substrate 101. In some embodiments, one package may include a block or the similar kind of blocks (e.g., the first and second non-volatile memory units 111 and 112, the controller 120, the buffer memory 130, or the display unit 150). As another example, one package may be composed of different kinds of blocks (e.g., a combination of two or more blocks among the first and second non-volatile memory units 111 and 112, the controller 120, the buffer memory 130, and the display unit 150).

Figure 1B:
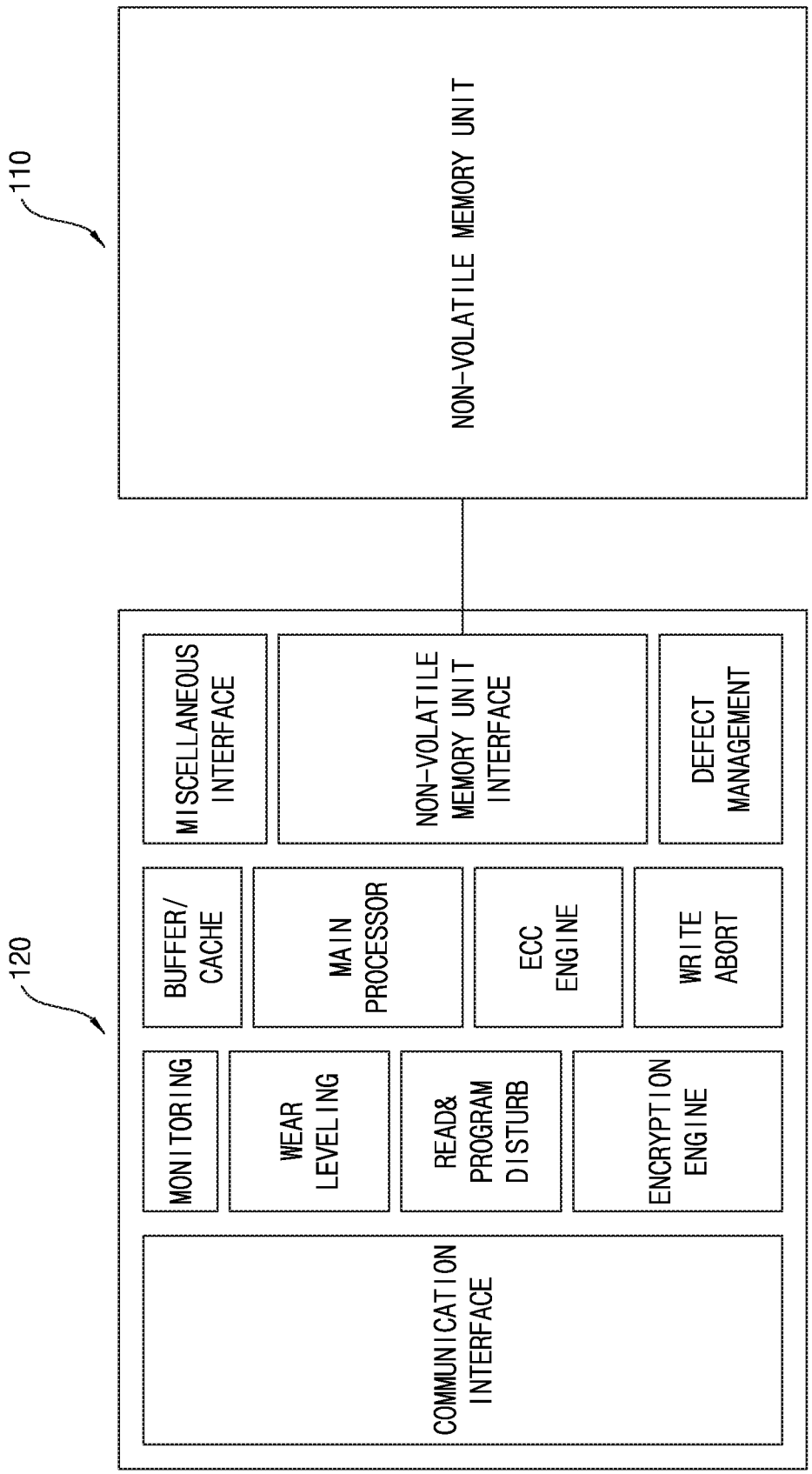

FIG. 1B is a block diagram showing functionality of the controller 120 according to example embodiments of the inventive concept. Referring to FIG. 1B, the controller 120 may perform functions of a communication interface, monitoring, wear leveling, read and program disturb, an encryption engine, a buffer or cache, a main processor, an error checking and correction (ECC) engine, write abort, a miscellaneous interface, a non-volatile memory unit interface, and/or defect management.

The communication interface may be an interface for connection between the storage device 100 and the host device 200. Through the communication interface, the storage device 100 may receive data, a command, or the like from the host device 200. For example, the communication interface may be at least one of a serial advanced technology attachment (SATA) interface, a secure digital (SD) interface, a universal serial bus (USB) interface, a parallel advanced technology attachment (PATA) or integrated drive electronics (IDE) interface, and/or a PCIe interface.

The controller 120 may monitor and record data related to characteristics of the storage device 100 and the memory included in the storage device 100. For example, the controller 120 may monitor a durability cycle of the non-volatile memory unit 110, estimate a life of the non-volatile memory unit 110 on the basis of the durability cycle, and/or report the estimated life to a user.

Wear leveling may be a function for evenly controlling the number of data writing cycles in the non-volatile memory unit 110 which is available. The number of data reading or writing cycles may be limited in the first non-volatile memories 111_1 to 111_n and the second non-volatile memories 112_1 to 112_n. When writing is performed in only one memory, durability cycles of the memory may be rapidly used up. The controller 120 evenly controls the number of write cycles in each memory by applying wear leveling and may monitor the number of writing cycles in each memory. In other words, write cycles may be substantially evenly distributed across various non-volatile memories to improve the lifespan of the non-volatile memory unit 110.

When reading or writing is performed on a cell in the non-volatile memory unit 110, cross coupling may occur between adjacent cells due to a fine wiring width, resulting in a value of a cell being inadvertently changed. The controller 120 may prevent a change of a cell value by applying the read and program disturb function. To recover from this type of value change error, the read and program disturb function may erase the cell in the non-volatile memory unit where the error occurred and reprogram the correct value to that cell in the non-volatile memory unit.

The encryption engine encrypts data or decrypts encrypted data. Various encryption and decryption algorithms may be used. For example, an advanced encryption standard (AES) 256 encryption engine may be applied to the controller 120.

To increase an operating rate, the controller 120 may additionally perform a function of temporarily storing and reading data while the controller 120 is operating. Such a function of the controller 120 may be the buffer or cache function. Additional memory units supplementing non-volatile memory unit 110 may be used by the buffer or cache function.

The main processor may determine and control an operation of the controller 120. For example, the main processor may include a reduced instruction set computer (RISC) which reduces load on hardware and software to reduce power consumption and increase the operating rate.

The ECC engine may be a function for detecting errors caused by various conditions and/or correct the detected errors.

The write abort function may be a function for preventing loss of data or firmware when the power supply is unexpectedly interrupted while data is being written in the non-volatile memory unit 110.

The miscellaneous interface may connect the controller 120 and a miscellaneous component. The non-volatile memory unit interface may connect the controller 120 and the non-volatile memory unit 110.

Defect management may be a function for replacing a cell region in which a defect has occurred with a normal preparatory cell region by changing memories or portions of memory to replace the cell region or a defective portion of the cell region.

Figure 2A:
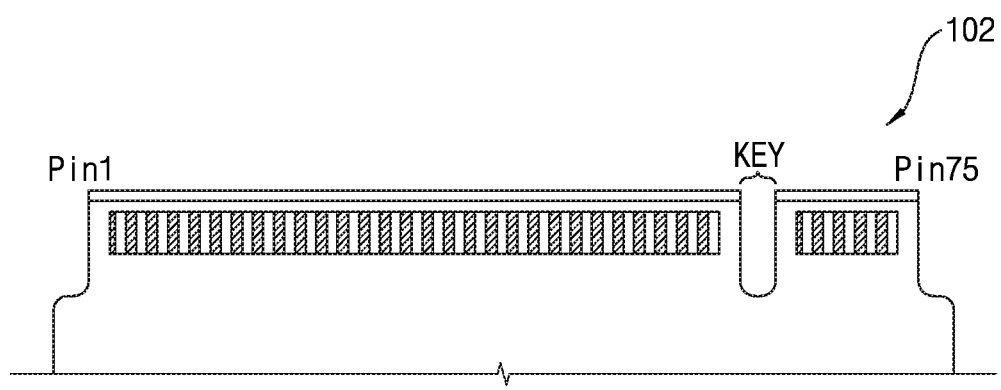
FIGS. 2A and 2B show an upper surface and a lower surface of a connector according to example embodiments of the inventive concept, respectively.
Figure 2B:
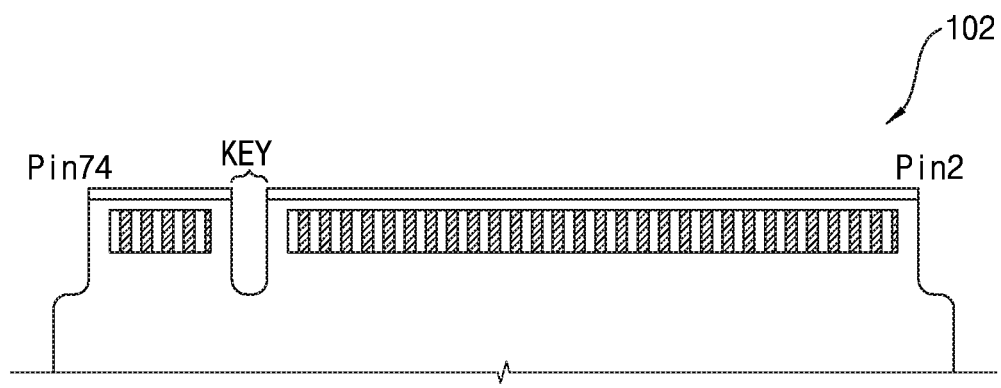

FIG. 2A shows an upper surface of the connector 102 according to example embodiments of the inventive concept, and FIG. 2B shows a lower surface of the connector 102 according to example embodiments of the inventive concept. As shown in FIG. 2A, odd-numbered pins among first to 75th pins may be disposed in parallel on the upper surface of the connector 102. As shown in FIG. 2B, even-numbered pins among the second to 74th pins may be disposed in parallel on the lower surface of the connector 102. The connector 102 may provide a key in which no pin is disposed. The key may prevent the connector 102 from being inverted when inserted into the host device 200. For example, the key may be off center of the connector 102 and may be formed at positions of the 59th to 66th pins (Pin59 to Pin66). Pins of the connector 102 may be arranged to support a communication interface such as PCIe. The arrangement of pins may be changed to support other communication interfaces.

FIG. 3 illustrates first connection terminals CT_1 according to example embodiments of the inventive concept. FIG. 3 shows a table of first to 75th pins of the connector 102 of FIG. 1A, and pins which may be used as the first terminals CT_1 connecting the host device 200 and the display unit 150 are indicated by thick lines.

The 59th to 66th pins (Pin59 to Pin66) correspond to the key shown in FIG. 2 and may not be provided in practice. However, the 59th to 66th pins (Pin59 to Pin66) are shown in FIG. 3 to clearly describe pin numbers. A portion of connector 102 corresponding to Pin59 to Pin66 may include a non-conductive material to improve alignment and/or orientation of connector 102 when connecting host device 200 and storage device 100.

The first, third, ninth, 15th, 21st, 27th, 33rd, 39th, 45th, 51st, 57th, 71st, 73rd, and 75th pins Pin1, Pin3, Pin9, Pin15, Pin21, Pin27, Pin33, Pin39, Pin45, Pin51, Pin57, Pin71, Pin73, and/or Pin75 may be configured to be connected to a ground voltage GND.

The second, fourth, 14th, 16th, 18th, 70th, 72nd, and 74th pins Pin2, Pin4, Pin14, Pin16, Pin18, Pin70, Pin72, and Pin74 may not be connected (not connected (N/C)) or receive a power of 3.3 V depending on a power mode. N/C may denote that a pin is not connected to the controller 120 through physical wiring. In some embodiments, N/C may denote that a pin is connected to the controller 120 through physical wiring but the controller 120 may not use the pin.

The 40th and 42nd pins (Pin40 and Pin42) may form a sideband interface as a part of a system management bus (SMBus). The 40th pin (Pin40) may input a clock SMB_CLK of the system management bus from the host device 200 to the connector 102 or may output the clock SMB_CLK from the connector 102 to the host device 200. The 40th pin (Pin40) may switch between 0 V and 1.8 V. The 42nd pin (Pin42) may input data SMB_DATA of the system management bus from the host device 200 to the connector 102 or may output the data SMB_DATA from the connector 102 to the host device 200. The 42nd pin (Pin42) may switch between 0 V and 1.8 V.

The 56th and 58th pins (Pin56 and Pin58) may be used during a manufacture process of the storage device 100. The 56th pin Pin56 may be reserved for manufacturing data transfer (MFG_DATA) during manufacturing. The 58th pin Pin58 may be reserved for manufacturing clock transfer (MFG_CLK) during manufacturing. The 56th and 58th pins (Pin56 and Pin58) may not be used after manufacturing of the storage device 100 is finished, i.e. during normal operation of the storage device 100.

The 68th pin (Pin68) may be used for receiving a suspend clock SUSCLK in a low-power mode. For example, the suspend clock SUSCLK may have a frequency of 32 kHz.

The fifth pin (Pin5) may be used as a third negative transmission terminal PETn3 in a PCIe communication interface. The seventh pin (Pin7) may be used as a third positive transmission terminal PETp3 in the PCIe communication interface. The 11st pin (Pin11) may be used as a third negative reception terminal PERn3 in the PCIe communication interface. The 13rd pin (Pin13) may be used as a third positive reception terminal PERp3 in the PCIe communication interface. The 17th pin (Pin17) may be used as a second negative transmission terminal PETn2 in the PCIe communication interface. The 19th pin (Pin19) may be used as a second positive transmission terminal PETp2 in the PCIe communication interface. The 23rd pin (Pin23) may be used as a second negative reception terminal PERn2 in the PCIe communication interface. The 25th pin (Pin25) may be used as a second positive reception terminal PERp2 in the PCIe communication interface. The 29th pin (Pin29) may be used as a first negative transmission terminal PETn1 in the PCIe communication interface. The 31st pin (Pin31) may be used as a first positive transmission terminal PETp1 in the PCIe communication interface. The 35th pin (Pin35) may be used as a first negative reception terminal PERn1 in the PCIe communication interface. The 37th pin (Pin37) may be used as a first positive reception terminal PERp1 in the PCIe communication interface. The 41st pin (Pin41) may be used as a zeroth negative transmission terminal PETn0 in the PCIe communication interface. The 43rd pin (Pin43) may be used as a zeroth positive transmission terminal PETp0 in the PCIe communication interface. The 47th pin (Pin47) may be used as a zeroth negative reception terminal PERn0 in the PCIe communication interface. The 49th pin (Pin49) may be used as a zeroth positive reception terminal PERp0 in the PCIe communication interface.

The 53rd pin (Pin53) may be used for receiving a negative reference clock REFCLKn in the PCIe communication interface. The 55th pin (Pin55) may be used for receiving a positive reference clock REFCLKp in the PCIe communication interface.

The 44th pin (Pin44) may be used for receiving or transmitting an alert signal ALERT # in the PCIe communication interface. The 44th pin (Pin44) may be included in the system management bus SMBus in the PCIe communication interface.

The 50th pin (Pin50) may be used for receiving a reset signal PERST #0 in the PCIe communication interface. The 52nd pin (Pin52) may be used for transmitting or receiving a clock request signal CLKREQ # in the PCIe communication interface. The 54th pin (Pin54) may be used for transmitting or receiving a wake signal PEWAKE # in the PCIe communication interface.

The 10th pin (Pin10) may be used by the storage device 100 to transmit a signal LED1# for controlling an external light-emitting diode (LED) to the outside (e.g., the host device 200).

The sixth, eighth, 20th, 22nd, 24th, 26th, 28th, 30th, 32nd, 34th, 36th, 38th, 46th, 48th, 67th, and 69th pins (Pin6, Pin8, Pin20, Pin22, Pin24, Pin26, Pin28, Pin30, Pin32, Pin34, Pin36, Pin38, Pin46, Pin48, Pin67, and Pin69) may be used for connecting the host device 200 and the display unit 150 in the PCIe communication interface. In other words, at least one of the sixth, eighth, 20th, 22nd, 24th, 26th, 28th, 30th, 32nd, 34th, 36th, 38th, 46th, 48th, 67th, and 69th pins (Pin6, Pin8, Pin20, Pin22, Pin24, Pin26, Pin28, Pin30, Pin32, Pin34, Pin36, Pin38, Pin46, Pin48, Pin67, and Pin69) may be a first connection terminal CT_1. The host device 200 may transmit the second display signal DS_2 to the display unit 150 through the first connection terminal CT_1.

The above-described use of pins is an example, and the number and function of each pin may vary according to a communication interface (e.g., a SATA communication interface).

Figure 4:
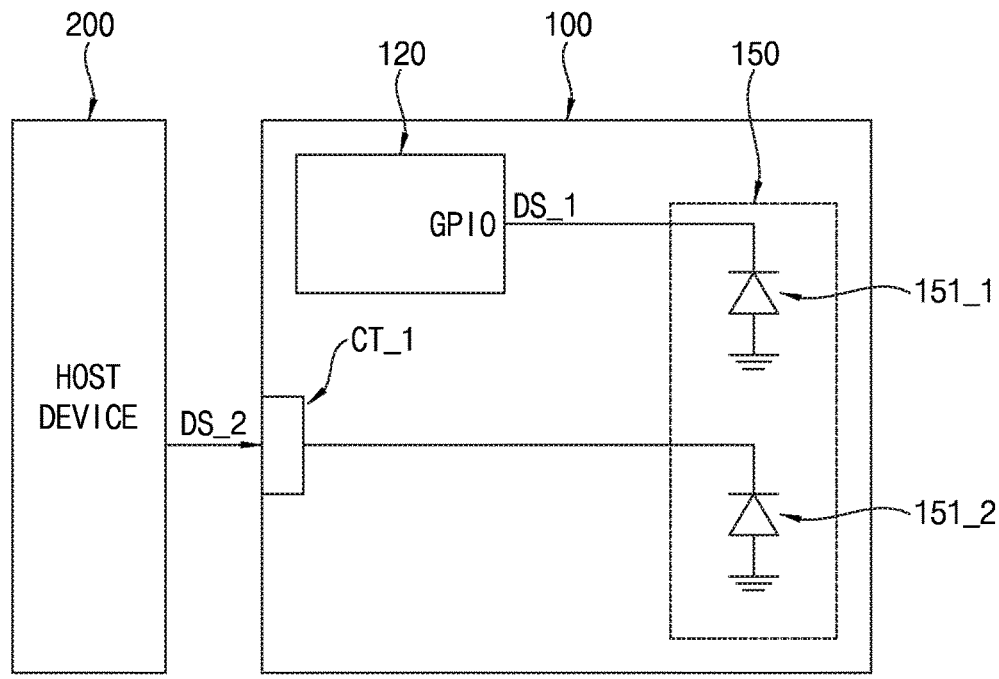
FIGS. 4 to 6 are block diagrams showing display units directly connected to a host device according to example embodiments of the inventive concept.
Figure 5:
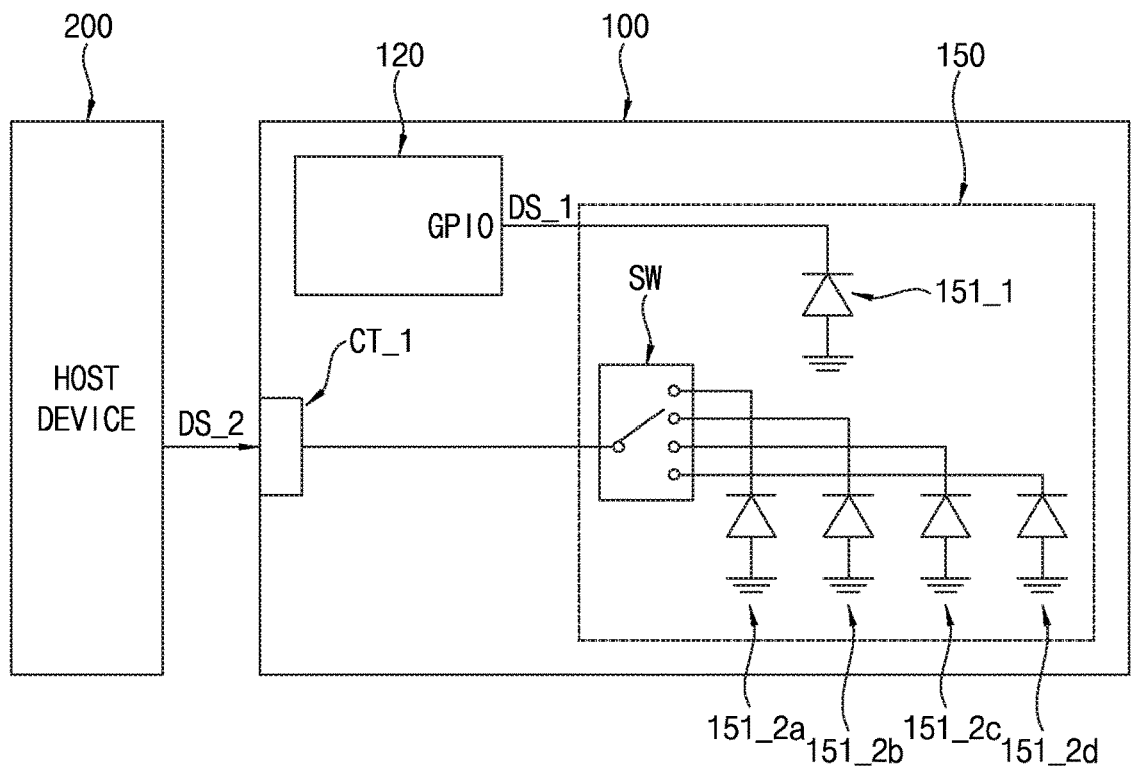
Figure 6:
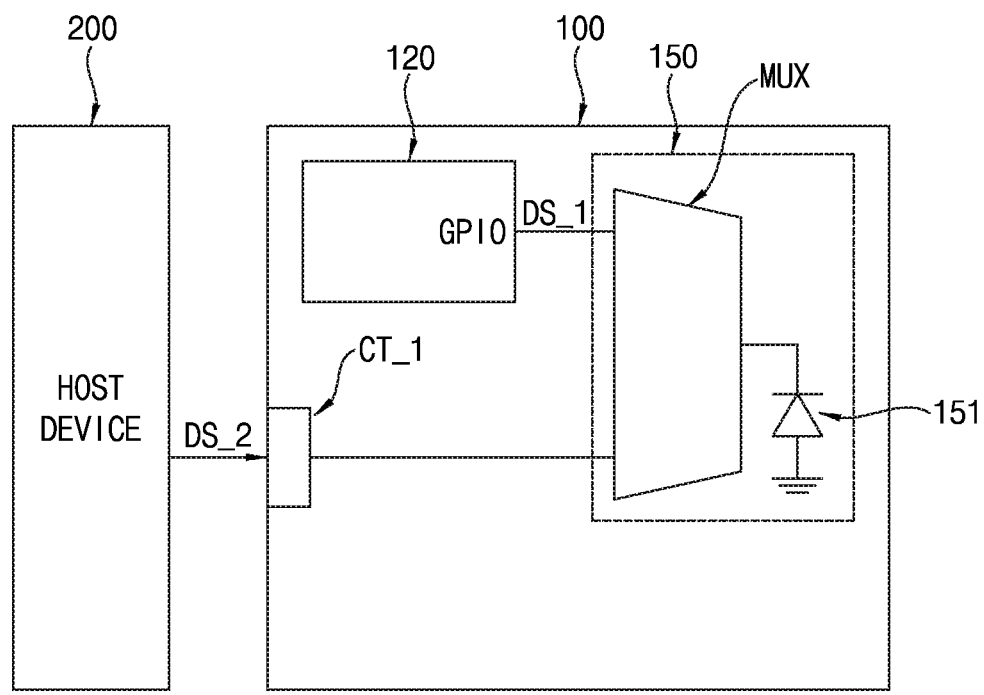

FIGS. 4 to 6 are block diagrams showing the display unit 150 directly connected to the host device 200 according to example embodiments of the inventive concept. The display unit 150 may include at least one light-emitting device 151. For example, the light-emitting device 151 may be an LED. The light-emitting device 151 may be disposed on a side exposed to a user. For example, the light-emitting device 151 may be disposed on a side of the substrate 101 opposite to another side of the substrate 101 on which the connector 102 has been formed. The light-emitting device 151 may be turned on, blinked, changed in brightness, or changed in color according to the first display signal DS_1 and the second display signal DS_2. According to such an operation of the light-emitting device 151, the first status information of the storage device 100, the second status information of the host device 200, and the like may be externally displayed.

Referring to FIG. 4, the display unit 150 may include a first light-emitting device 151_1 and a second light-emitting device 151_2. One end of the first light-emitting device 151_1 may be connected to a multipurpose input and output port GPIO of the controller 120, and the other end of the first light-emitting device 151_1 may be connected to a ground voltage. The first light-emitting device 151_1 may be driven according to the first display signal DS_1 indicating status of the controller 120. One end of the second light-emitting device 151_2 may be connected to a first connection terminal CT_1 of the connector 102, and the other end of the second light-emitting device 151_2 may be connected to the ground voltage. For example, the eighth pin (Ping) may be connected to the host device 200 as a first connection terminal CT_1 and used for transmitting the second display signal DS_2. The second light-emitting device 151_2 may be driven according to the second display signal DS_2 of the host device 200. The first light-emitting device 151_1 and the second light-emitting device 151_2 may be driven independently from each other. For example, the first light-emitting device 151_1 may display the first status information of the storage device 100, and the second light-emitting device 151_2 may display the second status information of the host device 200.

Referring to FIG. 5, the display unit 150 may include a plurality of second light-emitting devices 151_2a, 151_2b, 151_2c, and 151_2d and may additionally include a switch SW for selecting at least one of the plurality of second light-emitting devices 151_2a, 151_2b, 151_2c, and 151_2d. For example, the display unit 150 may include four second light-emitting devices 151_2a, 151_2b, 151_2c, and 151_2d. Ends of the plurality of second light-emitting devices 151_2a, 151_2b, 151_2c, and 151_2d may be connected to the switch SW, and the other ends of the plurality of second light-emitting devices 151_2a, 151_2b, 151_2c, and 151_2d may be connected to the ground voltage. The switch SW may be connected to a first connection terminal CT_1 of the connector 102. A second light-emitting device 151_2 selected by the switch SW may be driven according to the second display signal DS_2. The plurality of second light-emitting devices 151_2a, 151_2b, 151_2c, and 151_2d may each have addresses corresponding thereto, and it may be possible to select a corresponding second light-emitting device 151_2 by transmitting the second display signal DS_2 to an address according to a certain setting. The plurality of second light-emitting devices 151_2a, 151_2b, 151_2c, and 151_2d may be driven independently from each other and may externally display various status information of the host device 200. Other components including the first light-emitting device 151_1 and the connector 102 may be configured in a similar manner as those of FIG. 4.

Referring to FIG. 6, the display unit 150 may additionally include a multiplexer MUX which may select the first display signal DS_1 and the second display signal DS_2. The multiplexer MUX may be connected to each of a first connection terminal CT_1 and the controller 120 and receive the first display signal DS_1 and the second display signal DS_2. The multiplexer MUX may select one of the input first display signal DS_1 and second display signal DS_2 and output the selected display signal to the light-emitting device 151. The multiplexer MUX may select one of the first display signal DS_1 and the second display signal DS_2 according to a certain criterion or a selection of a user. When the display unit 150 includes the multiplexer MUX, it may be possible to externally display status of the storage device 100 or the host device 200 through the single light-emitting device 151. Components other than the display unit 150 may be the similar to those of FIG. 4.

Figure 7:
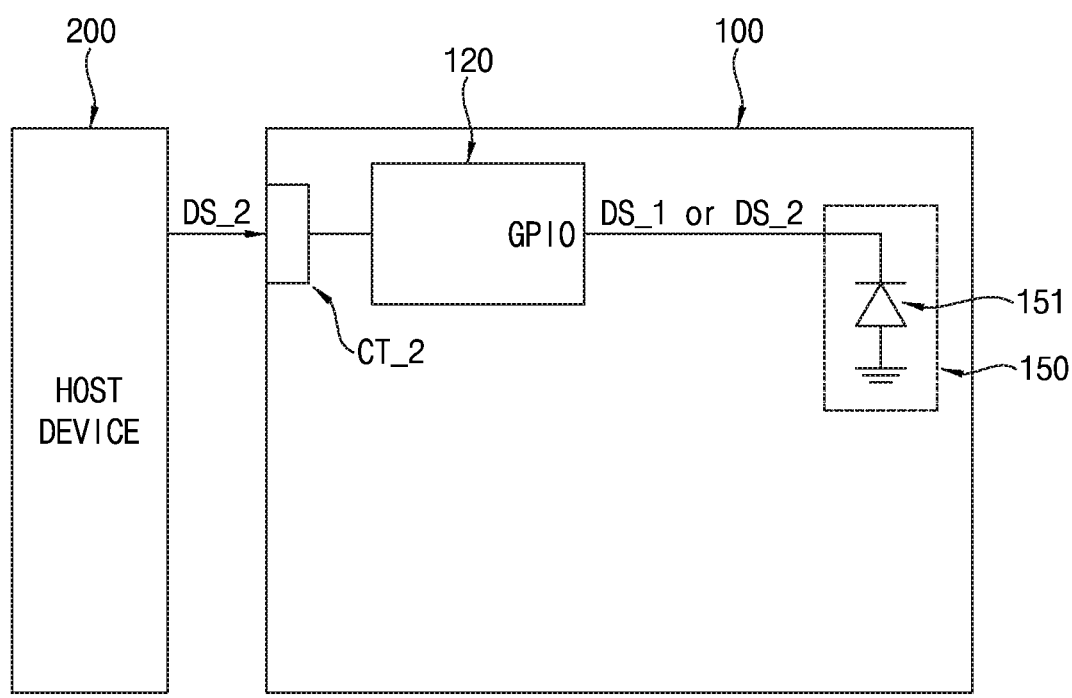
FIG. 7 is a block diagram showing a display unit connected to a host device through a controller according to example embodiments of the inventive concept.

FIG. 7 is a block diagram showing the display unit 150 connected to the host device 200 through the controller 120 according to example embodiments of the inventive concept. The display unit 150 is connected to the controller 120 and may externally display the first status information according to control of the controller 120 or externally display the second status information according to control of the host device 200 through the controller 120. The host device 200 may be connected to a second connection terminal CT_2 of the connector 102. The second connection terminal CT_2 may be connected to the controller 120. The multipurpose input and output port GPIO of the controller 120 may be connected to one end of the light-emitting device 151 of the display unit 150. The host device 200 may transmit the second display signal DS_2 to the storage device 100 through the second connection terminal CT_2. The controller 120 may receive the second display signal DS_2 through the second connection terminal CT_2. The controller 120 may select the first display signal DS_1 or the second display signal DS_2 according to a selection of a user or a certain condition. The controller 120 may output the selected first display signal DS_1 or second display signal DS_2 to the display unit 150 through the multipurpose input and output port GPIO. The light-emitting device 151 of the display unit 150 may be driven by the output first display signal DS_1 or second display signal DS_2.

FIG. 8 illustrates second connection terminals CT_2 according to example embodiments of the inventive concept. The second connection terminals CT_2 may be a system management bus SMBus. As described above, the system management bus SMBus may be 40th and 42nd pins (Pin40 and Pin42) and also used as the second connection terminals CT_2. The system management bus SMBus may be used for transferring management information between the host device 200 and the storage device 100. The management information may include manufacturer information, identification information of a device (e.g., a model number or a part number), error information, and/or other event information. A designer may include the second status information of the host device 200 in the management information and transmit the second display signal DS_2 to the storage device 100 through the system management bus SMBus. When the second display signal DS_2 is transmitted to the storage device 100 through the system management bus SMBus, a pin for transmitting the second display signal DS_2 may not be additionally needed.

FIG. 9 illustrates second connection terminals CT_2 according to example embodiments of the inventive concept. The second connection terminals CT_2 may be terminals for transmitting and/or receiving data. For example, in the PCIe communication interface, the second connection terminals CT_2 may be odd-numbered pins among a fifth pin (Pin5) to a 49th pin (Pin49). As described above, the second connection terminals CT_2 may be zeroth to third positive and negative transmission and reception terminals. The odd-numbered pins among the fifth pin (Pin5) to the 49th pin (Pin49) may be used for transferring data, which will be read, written, or deleted from the storage device 100, between the host device 200 and the storage device 100, and the data may include status information of the host device 200. The odd-numbered pins among the fifth pin (Pin5) to the 49th pin (Pin49) may transmit data including the second display signal DS_2 from the host device 200 to the controller 120 of the storage device 100. When the second display signal DS_2 is transmitted to the storage device 100 through the odd-numbered pins among the fifth pin (Pin5) to the 49th pin (Pin49), a pin for transmitting the second display signal DS_2 may not be additionally needed.

Figure 10:
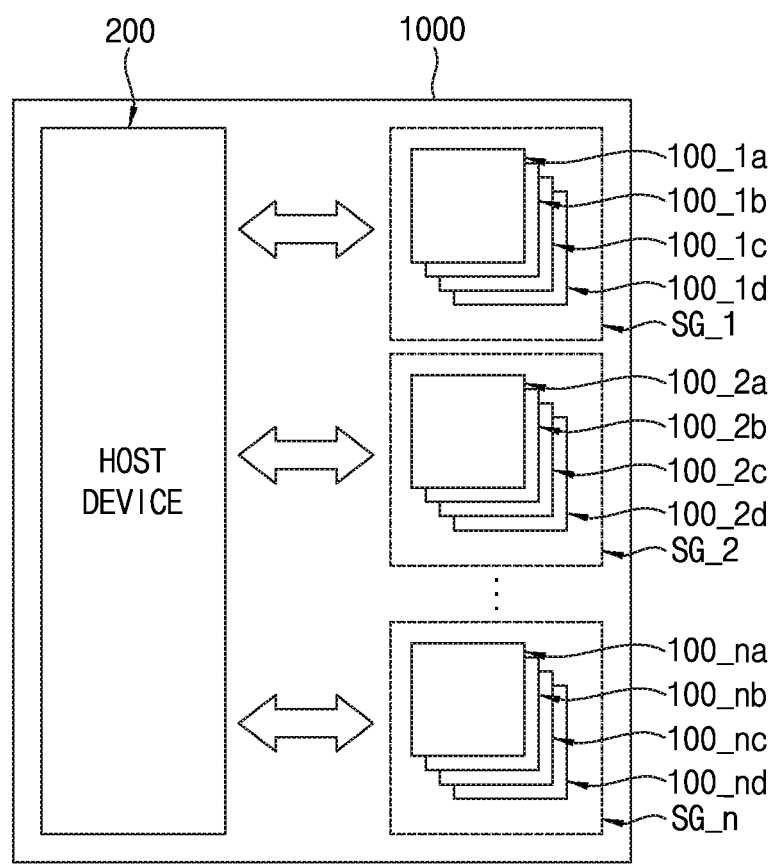
FIG. 10 is a block diagram showing a server device according to example embodiments of the inventive concept.

FIG. 10 is a block diagram showing a server device 1000 according to example embodiments of the inventive concept. The server device 1000 may include a host device 200 and a plurality of storage groups SG. The host device 200 may be connected in parallel with the plurality of storage groups SG, such as SG_1, SG_2, . . . , SG_n. The storage groups SG may include a plurality of storage devices 100. A plurality of storage devices 100 may be connected in parallel to each other and defined as one storage group SG, and the storage group SG in which the plurality of storage devices 100 are connected may be handled as one device. The host device 200 may divide data and separately store the divided data in the storage groups SG.

For example, redundant arrays of inexpensive disks (RAID) may be applied to the server device 1000, and the server device 1000 may additionally include a RAID controller (not shown) which manages data in stripe units.

FIG. 11 shows a tray 300 and a storage device 100 according to example embodiments of the inventive concept. Referring to FIG. 11, the tray 300 includes a plurality of slots, and each slot may be a space in which one storage device 100 is installed. The storage device 100 is inserted into one slot of the tray 300, and a connector 102 of the storage device 100 may be connected to a connector (not shown) in the tray 300. Storage devices 100 may be disposed in the tray 300 according to groups. The storage devices 100 may be disposed in the tray 300 so that storage devices 100 belonging to the same group are adjacent to each other. For example, storage devices 100 belonging to a first group may be disposed on the left, and storage devices 100 belonging to a second group may be disposed on the right.

The storage device 100 may additionally include a case 160. The case 160 may be attached to one side of a substrate 101 of the storage device 100. The case 160 may be disposed at a position at which the storage device 100 may be observed by a user when the storage device 100 is inserted into the tray 300. For example, the case 160 may be disposed on an opposite side to the connector 102. The case 160 may include at least one optical fiber 161 and/or an interface to the optical fiber 161 which transmits light of a light-emitting device 151 of a display unit 150. The optical fiber 161 may pass through the case 160 from an internal surface thereof to an external surface. One end of the optical fiber 161 may be at a position facing the light-emitting device 151 on the internal surface of the case 160, and the other end of the optical fiber 161 may be externally exposed on the external surface of the case 160. The light of the light-emitting device 151 may be transmitted from the one end of the optical fiber 161 to the other end, and finally a user may observe the light of the light-emitting device 151 on the external surface of the case 160. For example, the case 160 may include a first optical fiber 161_1 and a second optical fiber 161_2. The first optical fiber 161_1 may transmit light of the first light-emitting device 151_1 shown in FIG. 4, and the second optical fiber 161_2 may transmit light of the second light-emitting device 151_2. The case 160 may include the optical fiber 161 in correspondence with the light-emitting device 151 of the display unit 150.

FIG. 11 shows that packages 103 are attached onto the substrate 101 of the storage device 100 as an example. Each of the packages 103 may include at least one of the non-volatile memory unit 110, the controller 120, the buffer memory 130, the display unit 150, and the safety circuit 140 of FIG. 1.

Figure 12A:
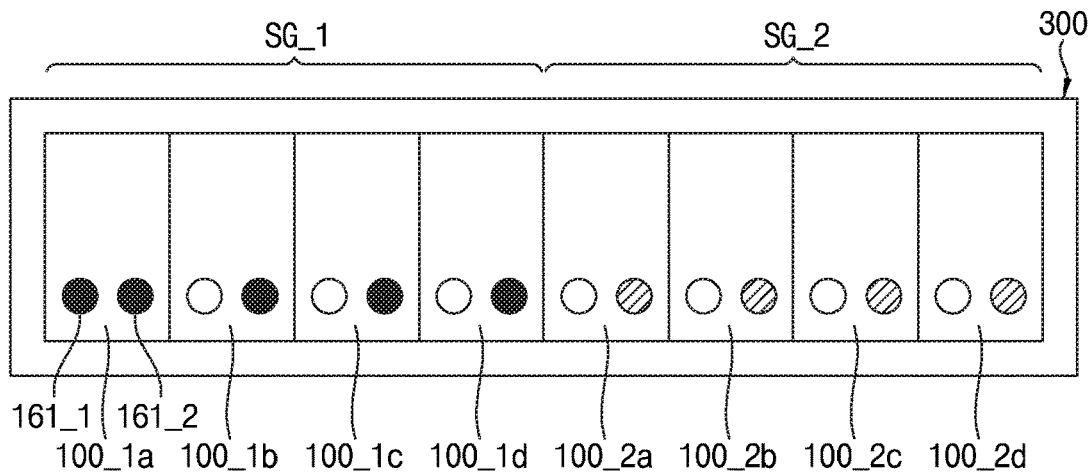
FIGS. 12A to 12C are front views of a plurality of storage devices held in a tray according to example embodiments of the inventive concept.
Figure 12B:
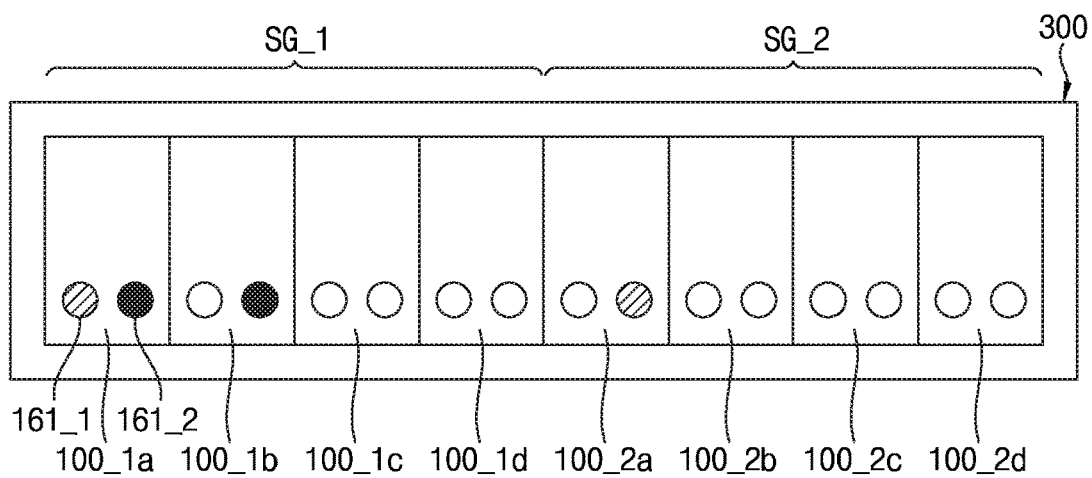
Figure 12C:
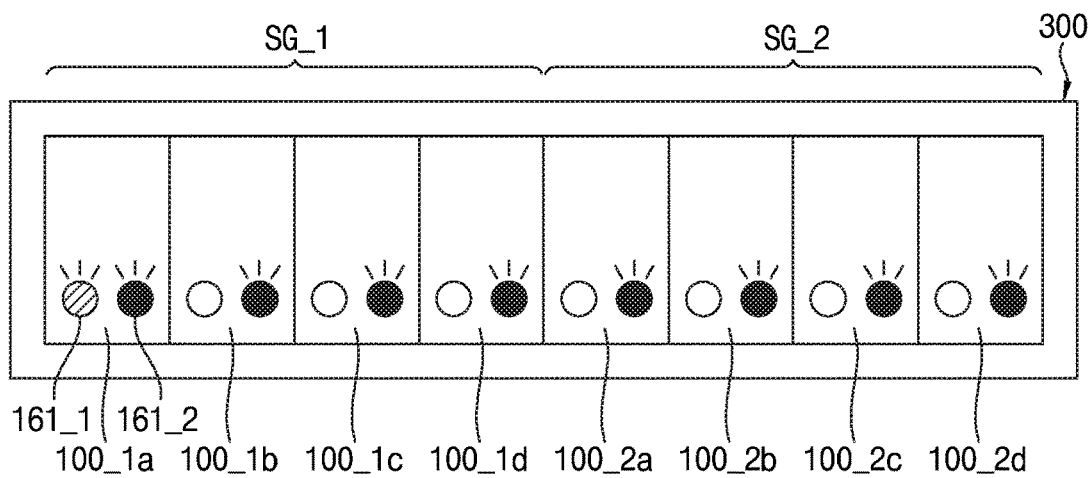

FIGS. 12A to 12C are front views of a plurality of storage devices 100 held in the tray 300 according to example embodiments of the inventive concept. When the storage device 100 shown in FIGS. 1, 2, 3, and 4 is applied to the tray 300 shown in FIG. 11 as an example, storage groups SG may be classified into a first storage group SG_1 and a second storage group SG_2 as shown in FIGS. 12A to 12C. First optical fibers 161_1 and second optical fibers 161_2 shown in FIG. 12A to 12C are operated by the first display signal DS_1 and the second display signal DS_2, respectively.

Referring to FIG. 12A, a first optical fiber 161_1 of a leftmost storage device 100_1a may show a first color. Second optical fibers 161_2 of storage devices 100_1a, 100_1b, 100_1c, and 100_1d belonging to the first storage group SG_1 may show the first color, and second optical fibers 161_2 of storage devices 100_2a, 100_2b, 100_2c, and 100_2d belonging to the second storage group SG_2 may show a second color. For example, the first optical fiber 161_1 of the storage device 100_1a which shows the first color according to the first display signal DS_1 may indicate replacement time information of a non-volatile memory unit 110 of the storage device 100_1a. Also, for example, second optical fibers 161_2 of the first storage group SG_1 which show the first color according to the second display signal DS_2 may indicate that the corresponding storage group SG_1 has been connected through a PCIe communication interface, and second optical fibers 161_2 of the second storage group SG_2 which show the second color may indicate that the storage group SG_2 has been connected through a SATA communication interface.

Referring to FIG. 12B, a first optical fiber 161_1 of a leftmost storage device 100_1a may show the second color. Second optical fibers 161_2 of two storage devices 100_1a and 100_1b belonging to the first storage group SG_1 may show the first color, and a second optical fiber 161_2 of one storage device 100_2a belonging to the second storage group SG_2 may show the second color. For example, the first optical fiber 161_1 of the leftmost storage device 100_1a which shows the second color may indicate that a replacement time of a capacitor of a safety circuit 140 of the corresponding storage device 100_1a has come according to the first display signal DS_1. Also, for example, the second optical fibers 161_2 of the two storage devices 100_1a and 100_1b in the first storage group SG_1 which show the first color may indicate that 2/4 of the capacity of the first storage group SG_1 is in use, and the second optical fiber 161_2 of the one storage device 100_2a in the second storage group SG_2 which shows the second color may indicate that ¼ of the capacity of the second storage group SG_2 is in use.

Referring to FIG. 12C, a first optical fiber 161_1 of a leftmost storage device 100_1a may blink in the second color. Second optical fibers 161_2 of storage devices 100_1a, 100_1b, 100_1c, 100_1d, 100_2a, 100_2b, 100_2c, and 100_2d belonging to the first storage group SG_1 and the second storage group SG_2 may blink in the first color. For example, the first optical fiber 161_1 of the leftmost storage device 100_1a blinking in the first second color may indicate that an unidentified error has occurred in the corresponding storage device 100_1a according to the first display signal DS_1. Also, for example, the second optical fibers 161_2 of the first and second storage groups SG_1 and SG_2 blinking in the first color may indicate that the internal temperature of the host device 200 is a certain temperature or higher.

The embodiments shown in FIGS. 12A to 12C are examples. In some embodiments, a first optical fiber 161_1 showing the first color may indicate temperature status information of a storage device 100. Also, when one light-emitting device 151 is included as shown in FIG. 6 by way of example, an optical fiber 161 showing the first color may be set to indicate capacity status of the storage device 100, and the optical fiber 161 showing the second color may be set to indicate that a certain device included in the server device 1000 is in a failure state.

A plurality of storage devices 100 may be installed in the tray 300 of the server device 1000. With the development of semiconductor technology, the tray 300 is reduced in size to efficiently manage the installation space of the server device 1000. Due to the reduction in size of the tray 300, it may be difficult to additionally install a device for externally displaying status of the host device 200 and the like. According to example embodiments of the inventive concept, it may be possible to externally display status of the host device 200 and the like using the display unit 150 of the storage device 100 without additionally installing a separate display device. Accordingly, spatial utilization may be improved.

According to the example embodiments of the inventive concept, it may be possible to externally display status information through a storage device without adding a display unit. Accordingly, spatial utilization may be improved, and a server device may be reduced in size.

While the embodiments of the inventive concept have been described with reference to the accompanying drawings, it should be understood by those skilled in the art that various modifications may be made without departing from the scope of the inventive concept and without changing essential features thereof. Therefore, the above-described embodiments should be considered in a descriptive sense only and not for purposes of limitation.

What is claimed is:
1. A storage device comprising:
 a non-volatile memory unit;
 a connector comprising a plurality of pins that are configured to connect to a host device that is external to the storage device;
 a display unit comprising at least one light-emitting device; and
 a controller configured to communicate with the host device through the connector and configured to control the non-volatile memory unit,
 wherein the display unit is configured to directly connect to the controller and is configured to directly connect to the host device, and
 wherein the display unit is selectively configured to display first status information according to direct control of the controller and selectively display second status information according to direct control of the host device.

2. The storage device of claim 1, wherein the at least one light-emitting device of the display unit comprises:
 a first light-emitting device connected to the controller; and
 a second light-emitting device connected to the host device.

3. The storage device of claim 2, further comprising:
 a plurality of second light-emitting devices comprising the second light-emitting device, and
 wherein the display unit further comprises a switch configured to select at least one of the plurality of second light-emitting devices.

4. The storage device of claim 1, wherein the display unit further comprises a multiplexer configured to select one of the controller or the host device to connect to the light-emitting device.

5. The storage device of claim 1,
 wherein the controller communicates with the host device through a peripheral component interconnect express (PCIe) communication interface,
 wherein the display unit is connected to the host device through a first connection terminal of the connector, and
 wherein the first connection terminal is at least one of a sixth pin, an eighth pin, a 20th pin, a 22nd pin, a 24th pin, a 26$^{th}$ pin, a 28th pin, a 30th pin, a 32nd pin, a 34th pin, a 36th pin, a 38th pin, a 46th pin, a 48th pin, a 67th pin, or a 69th pin conforming to a PCIe M.2 standard.

6. The storage device of claim 1,
 wherein the first status information comprises at least one of internal temperature status information of the storage device, error occurrence information indicating that an error has occurred in the storage device, storage capacity information of the non-volatile memory unit, or memory replacement time information of the non-volatile memory unit.

7. The storage device of claim 1, further comprising:
a safety circuit comprising a capacitor configured to provide power to the storage device when a main power source is interrupted,
wherein the first status information comprises replacement time information of the capacitor.

8. The storage device of claim 1, wherein the second status information comprises at least one of error occurrence information indicating that an error has occurred in the host device, internal temperature status information of the host device, or communication interface information between the host device and the storage device.

9. The storage device of claim 1, further comprising:
a case configured to be coupled to one side of a substrate of the storage device and comprises an optical interface to an optical fiber which transmits light of the light-emitting device.

10. A storage device comprising:
a non-volatile memory unit;
a connector comprising a plurality of pins that are configured to connect to a host device that is external to the storage device;
a display unit comprising at least one light-emitting device and is configured to directly connect to the host device through the connector; and
a controller configured to connect to the host device through the connector and configured to control the non-volatile memory unit,
wherein the display unit is connected to the controller and configured to selectively display first status information according to control of the controller and configured to selectively display second status information according to direct control of the host device.

11. The storage device of claim 10,
wherein the controller communicates with the host device through a peripheral component interconnect express (PCIe) communication interface and is connected to the host device through a second connection terminal of the connector, and
wherein the second connection terminal is a system management bus.

12. The storage device of claim 11, wherein the second connection terminal corresponds to a 40th pin and a 42nd pin of the connector conforming to a peripheral component interconnect express (PCIe) M.2 standard.

13. The storage device of claim 10,
wherein the controller communicates with the host device through a peripheral component interconnect express (PCIe) communication interface and is connected to the host device through a second connection terminal of the connector, and
wherein the second connection terminal corresponds to odd-numbered pins among fifth to 49th pins of the connector conforming to a PCIe M.2 standard.

14. The storage device of claim 10, wherein the first status information comprises at least one of internal temperature status information of the storage device, error occurrence information indicating that an error has occurred in the storage device, storage capacity information of the non-volatile memory unit, or memory replacement time information of the non-volatile memory unit.

15. The storage device of claim 10, further comprising:
a safety circuit comprising a capacitor configured to provide power to the storage device when a main power source is interrupted,
wherein the first status information comprises replacement time information of the capacitor.

16. The storage device of claim 10, wherein the second status information comprises at least one of error occurrence information indicating that an error has occurred in the host device, internal temperature status information of the host device, or communication interface information between the host device and the storage device.

17. A server device comprising:
a host device; and
a plurality of storage devices that belong to ones of a plurality of storage groups respectively connected in parallel to the host device,
wherein ones of the plurality of storage devices comprises:
a non-volatile memory unit;
a connector comprising a plurality of pins connected to the host device;
a controller configured to communicate with the host device through the connector and configured to control the non-volatile memory unit; and
a display unit comprising a first light-emitting device connected to the controller which is configured to display first status information or second status information according to control of the controller or the host device, a plurality of second light-emitting devices, and a switch connected through the connector to the host device,
wherein the switch is under control of the host device and is configured to select at least one of the plurality of second light-emitting devices.

18. The server device of claim 17, wherein the display unit is connected to the controller and the host device.

19. The server device of claim 17,
wherein the display unit is connected to the host device through the controller, and
wherein the first status information and/or the second status information provide respective usage information of non-volatile memory units related to ones of the plurality of storage devices.

20. The server device of claim 17,
wherein the second status information comprises storage capacity information of the storage groups, and
wherein display units of the plurality of storage devices are operated in proportion to ratios of storage capacities of the storage groups in use.

* * * * *